United States Patent
Matsushima

(10) Patent No.: US 6,232,652 B1
(45) Date of Patent: May 15, 2001

(54) SEMICONDUCTOR DEVICE HAVING A PACKAGED SEMICONDUCTOR ELEMENT AND PERMANENT VENT AND MANUFACTURING METHOD THEREOF

(75) Inventor: Hironori Matsushima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,675

(22) Filed: Nov. 23, 1999

(30) Foreign Application Priority Data

Jun. 8, 1999 (JP) .................................................. 11-161657

(51) Int. Cl.⁷ .......................... H01L 23/04; H01L 29/82; H01L 23/10; H05K 7/20

(52) U.S. Cl. .......................... 257/667; 257/738; 257/737; 257/778; 257/704; 257/774; 257/680; 257/668

(58) Field of Search .................................... 257/738, 646, 257/667, 680, 774, 700, 701, 737, 734, 648, 720, 704

(56) References Cited

U.S. PATENT DOCUMENTS

| 5,414,293 | * | 5/1995 | Broom | 257/667 |
| 5,652,463 | * | 7/1997 | Weber et al. | 257/667 |
| 5,692,296 | * | 12/1997 | Variot | 257/676 |
| 5,760,467 | * | 6/1998 | Itihasi | 257/667 |
| 5,905,301 | * | 5/1999 | Ichikawa et al. | 257/676 |
| 5,909,057 | * | 6/1999 | McCormick et al. | 257/704 |

FOREIGN PATENT DOCUMENTS

| 63-84051 | 4/1988 | (JP) . | |
| 2-222564 | * 9/1990 | (JP) | 257/667 |
| 6-151620 | 5/1994 | (JP) . | |
| 6-169026 | 6/1994 | (JP) . | |

* cited by examiner

*Primary Examiner*—Alexander O. Williams
(74) *Attorney, Agent, or Firm*—McDermott, Will & Emery

(57) ABSTRACT

In a semiconductor device, a semiconductor chip is mounted on a planar substrate approximately at the center and a hollow cavity for housing the semiconductor chip is formed by laminating an annular ring member, annular adhesive tapes, and a heat spreader plate on the substrate. A slit is formed in the adhesive tape or the ring member to provide an air vent.

4 Claims, 8 Drawing Sheets

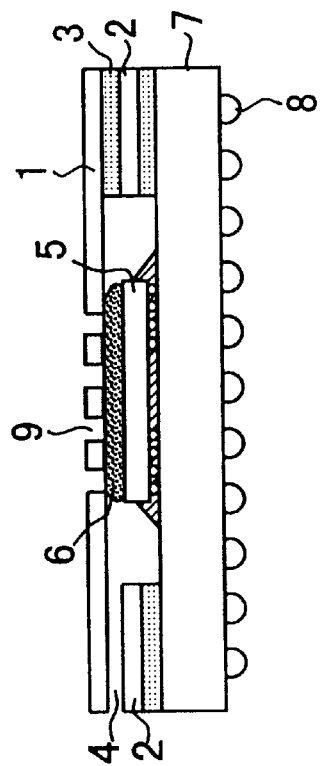
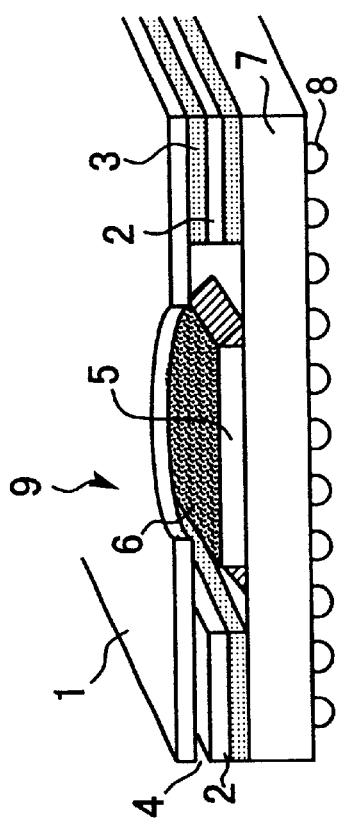
Fig. 5A
Fig. 5B

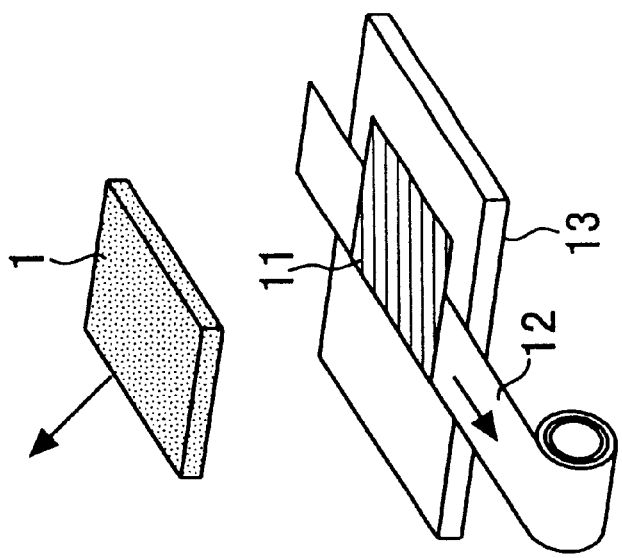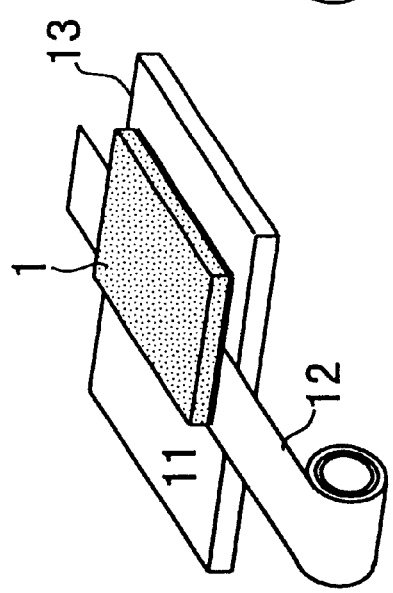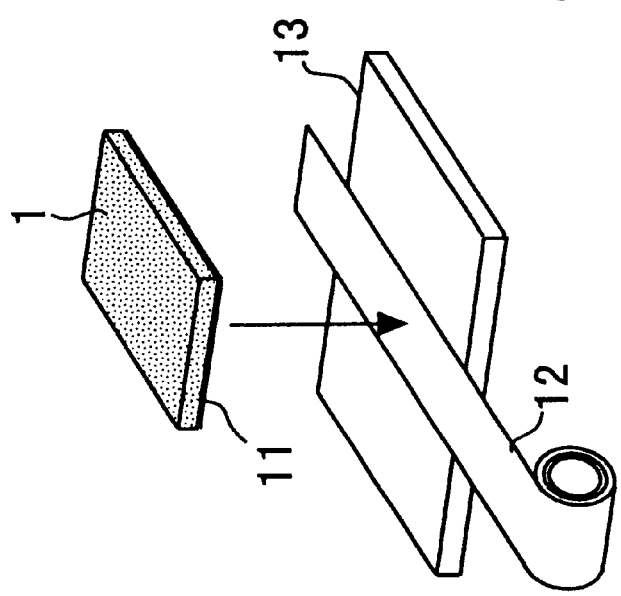

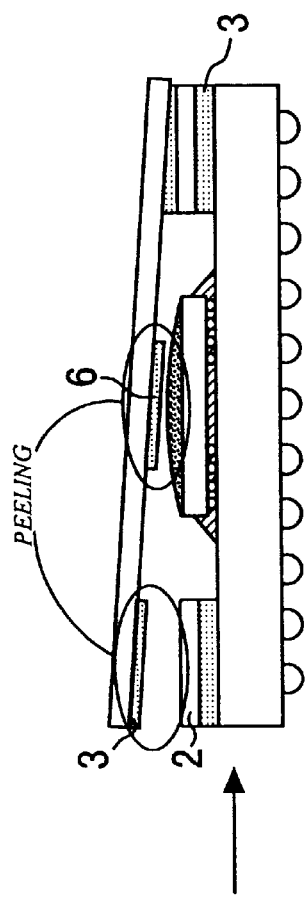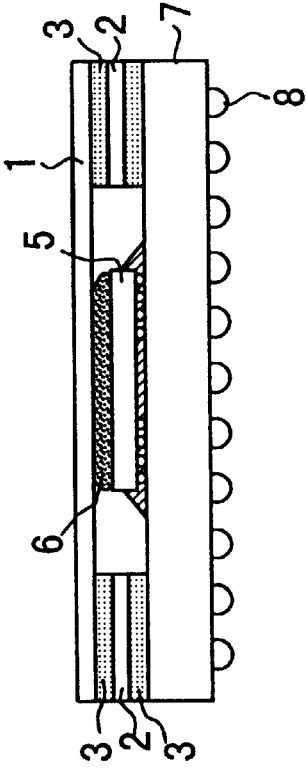

US 6,232,652 B1

SEMICONDUCTOR DEVICE HAVING A PACKAGED SEMICONDUCTOR ELEMENT AND PERMANENT VENT AND MANUFACTURING METHOD THEREOF

BACKGROUND OF THE INVENTION

1. Field of the Invention

The present invention relates to a semiconductor device, as well as a manufacturing method thereof, in which semiconductor elements are housed in a package. More specifically, the present invention relates to a structure of a semiconductor device that has a heat spreader, a cap, or the like and in which the semiconductor elements are housed in a hollow cavity, and a manufacturing method thereof.

2. Background Art

FIG. 8 shows an example structure of a conventional semiconductor device in package form. For example, the conventional semiconductor device is configured by a BGA substrate 7, a semiconductor chip 5 that is flip-chip-bonded to the BGA substrate 7 via solder bumps, a sealing member capable of improving the reliability of the above bonding, solder balls 8 that are arranged on the back surface of the BGA substrate 7 to obtain electrical connections with an external apparatus, a heat spreader 1 for dissipating heat outward that is generated in the semiconductor chip 5, a heat-dissipating resin 6 that accelerates heat conduction between the semiconductor chip 5 and the heat spreader 1, a ring 2 and adhesive tapes 3 that join the BGA substrate 7 and the heat spreader 1 to each other while providing a prescribed gap in between.

In a manufacturing process of the above-type of semiconductor device, the temperature becomes higher than the solder melting temperature, for example, in a step in which sealing is made with the heat spreader or the cap made of a metal such as copper, ceramics, an organic material, or the like and in subsequent steps in which, for example, solder balls are formed or the semiconductor device is mounted on a board by reflow. There is a problem that in those steps sealed air thermally expands to possibly deform or peel off the heat spreader 1.

FIG. 9a and 9b illustrate such a state. Peeling occurs between the heat spreader 1 and the heat-dissipating resin 6 or between the heat-dissipating resin 6 and the semiconductor chip 5, which results in a problem that the heat dissipation characteristic of the semiconductor device is deteriorated.

In case of improving the effect of dissipating heat outward by providing radiation fins on the semiconductor device, it is necessary to increase the heat conductivity from the semiconductor device to the radiation fins.

When the semiconductor device is manufactured, the heat spreader and the ring are attached by thermal pressure bonding using a pressurizing head. There is a problem that the semiconductor chip may be damaged in this operation. Further, since the heat-dissipating resin starts to set immediately, voids may be produced inside the heat-dissipating resin, deteriorating the heat dissipation characteristic.

Further, when the semiconductor device is manufactured, it is necessary to peel off a cover film that is provided on that surface of each of the heat spreader and the ring to which a thermosetting adhesive tape, for example, adheres.

The present invention has been made to solve the above problems in the conventional art, and an object of the invention is therefore to provide a semiconductor device and a manufacturing method thereof which can prevent damaging of a semiconductor chip of the semiconductor device as well as deterioration in the heat dissipation characteristic of the semiconductor device.

SUMMARY OF THE INVENTION

According to one aspect of the present invention, a semiconductor device comprises a planar substrate and a semiconductor chip mounted on the planar substrate approximately at the center thereof. Further, the semiconductor devise comprises an annular ring member, annular adhesive tapes, and a heat spreader plate that are laminated on the substrate so as to form a hollow cavity that houses the semiconductor chip, and at least one of the adhesive tapes has a slit to serve as an air vent.

In another aspect of the present invention, the annular ring member has a slit to serve as an air vent.

According to still another aspect of the present invention, in a method of manufacturing a semiconductor device, a semiconductor chip is mounted on a planar substrate approximately at the center thereof. An annular ring member, annular adhesive tapes, and a heat spreader plate are laminated on the planar substrate, and bonded to the planar substrate by applying pressure only above the position of the annular adhesive tapes by using a pressurizing head having an annular protrusion.

Other and further objects, features and advantages of the invention will appear more fully from the following description.

BRIEF DESCRIPTION OF THE DRAWINGS

FIG. 5A is a cut out perspective view of a semiconductor device according to a third embodiment of the present invention.

FIG. 5B is a cross sectional view of another semiconductor device according to the third embodiment of the present invention.

FIGS. 7A–7C illustrate a semiconductor device manufacturing method according to a fifth embodiment of the present invention.

FIGS. 9a and 9b illustrate peeling in a package of a conventional semiconductor device.

DETAILED DESCRIPTION OF THE PREFERRED EMBODIMENTS

Figure 1:
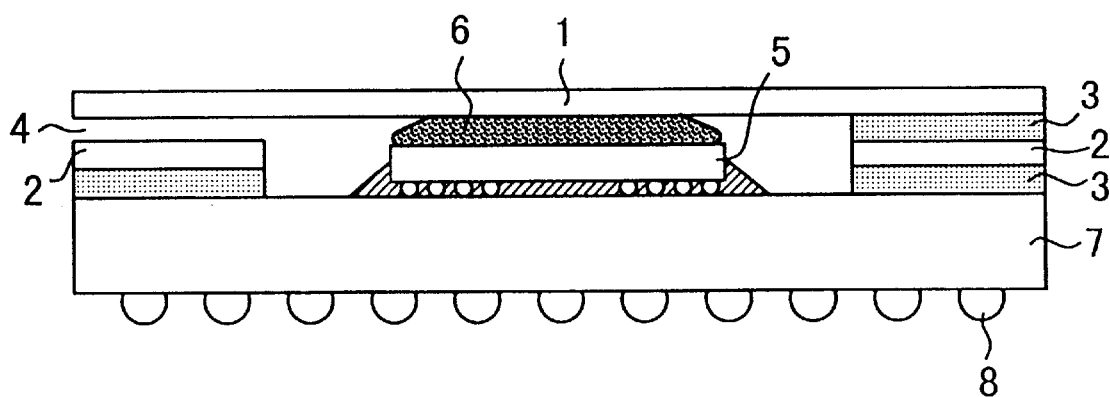
FIG. 1 is a sectional view showing a structure of a semiconductor device according to a first embodiment of the present invention.

Some embodiments of the present invention will be hereinafter described with reference to the accompanying drawings. The parts corresponding to each other in the drawings are given the same reference numerals and their descriptions may be simplified or omitted where appropriate.

First Embodiment

Figure 2A:
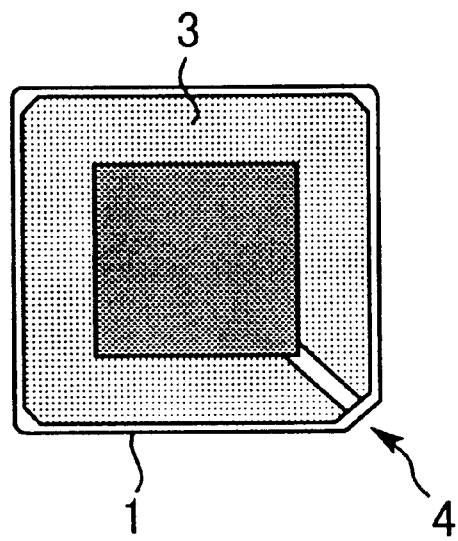
FIG. 2A is a plan view showing a slit of an adhesive tape used in the first embodiment.
Figure 2B:
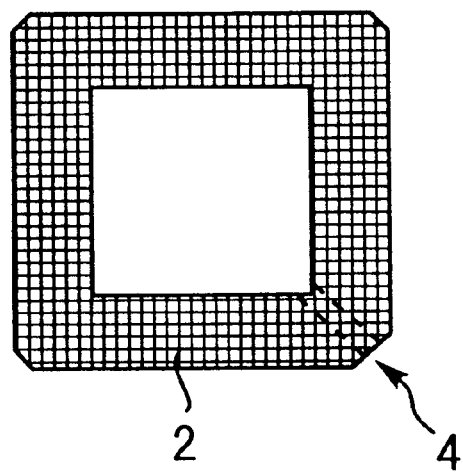
FIG. 2B is a plan view showing a ring used in the first embodiment.

FIG. 1 and FIGS. 2A and 2B illustrate a semiconductor device according to a first embodiment of the present invention. FIG. 1 is a sectional view showing the structure of the semiconductor device of the embodiment having an air vent. FIG. 2A is a plan view showing a slit of an adhesive tape. FIG. 2B is a plan view showing a ring.

In FIG. 1, reference numeral 1 denotes a planar heat spreader (heat spreader plate); 2, a rectangular annular ring (ring member); 3, rectangular annular adhesive tapes having a slit; 4, a slit formed in the adhesive tape(s) 3 and serving as an air vent; 5, a semiconductor chip; 6, a heat-dissipating resin; 7, a BGA substrate; and 8, solder balls.

In this semiconductor device, the semiconductor chip 5 is flip-chip-bonded to the BGA substrate 7 via solder bumps and sealed with a sealing member. The space between the semiconductor chip 5 and the heat spreader 1 is charged with the heat-dissipating resin 6 that accelerates heat conduction; that is, the semiconductor chip 5 and the heat spreader 1 are bonded to each other with the heat-dissipating resin 6. The heat spreader 1 dissipates heat outward that is generated in the semiconductor chip 5.

The ring 2 and the adhesive tapes 3 are laminated at the four sides between the BGA substrate 7 and the heat spreader 1 to join them to each other in such a manner that a prescribed gap is formed in between. The adhesive tape(s) 3 is formed with the slit 4 serving as an air vent.

The solder balls 8 are arranged on the back surface of the BGA substrate 7 to obtain electrical connections with an external apparatus.

FIG. 2A shows a joining state between the heat spreader 1 and the one adhesive tape 3 as viewed from below (i.e., from the side of the semiconductor chip 5) in FIG. 1. As shown in FIG. 2A, the rectangular annular adhesive tape 3 is joined to the heat spreader 1 and the slit 4 is formed in the adhesive tape 3 at one corner.

FIG. 2B shows a joining state between the one adhesive tape 3 and the ring 2 as viewed as viewed from below in FIG. 1. As shown in FIG. 2B, the ring 2 is joined to the one rectangular annular adhesive tape 3.

The adhesive tape 3 shown in FIGS. 2A and 2B is, for example, thermosetting, heat-resistant, and insulating. The slit 4 of the one adhesive tape 3 serves as an air vent portion of the semiconductor device of FIG. 1 after manufacture.

According to this embodiment, since the semiconductor device has the air vent portion, there does not occur the problem of the conventional device as described above in connection with FIG. 9 that the air in the hollow cavity is expanded, for example, at the time of curing of the adhesive tapes 3 or reflow heating, to possibly deform the heat spreader 1 or peel off the heat spreader 1 or the ring 2.

The slit 4 may be formed in one of the adhesive tapes 3 that is bonded to the heat spreader 1 or the BGA substrate 7, or in both adhesive tapes 3.

As shown in FIGS. 2A and 2B, the adhesive tapes 3 and the ring 2 have the same shape and they are the same as the heat spreader 1 in external shape. Therefore, as shown in FIG. 1, by bonding the semiconductor chip 5 to the heat spreader 1 via the heat-dissipating resin 6 at the center of the heat spreader 1 in manufacturing the semiconductor device, outward dissipation of heat that is generated in the semiconductor chip 5 can be promoted.

Figure 3:
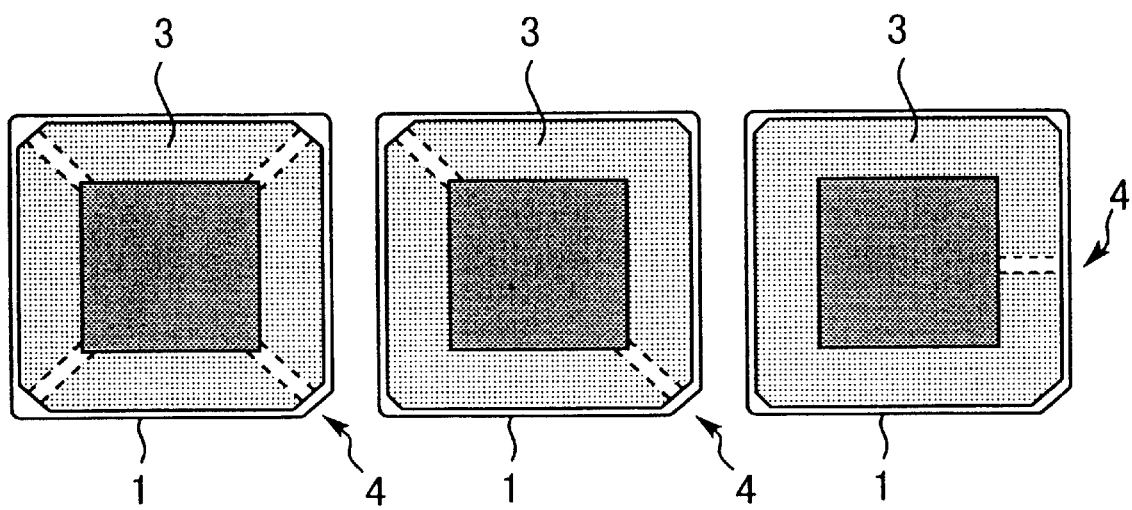
FIG. 3 shows respective plan views showing other arrangement of slits in the adhesive tapes in the first embodiment.

FIG. 3 shows respective plan views showing other arrangement examples of slits of the adhesive tape(s) 3. As shown in FIG. 3, slits may be formed at two or four corners or in a side of the adhesive tape(s) 3.

As described above, according to this embodiment, the deterioration in the heat dissipation characteristic of the semiconductor device can be prevented that would otherwise be caused by peeling of the heat spreader 1 from the heat-dissipating resin 6 that is bonded to the semiconductor chip 5 and serves for heat conduction or peeling of the heat-dissipating resin 6 from the semiconductor chip 5.

Cracking of the BGA substrate 7 etc. and disconnection of the internal wiring can be prevented that would otherwise be caused by deformation of the semiconductor device.

Since the slit 4 of the adhesive tape(s) 3 remains in a semiconductor device product, it serves as the air vent portion in plural times of heating processes.

Furthermore, according to this embodiment, it is not necessary to form a vent portion such as a hole or a slit in the base material of the heat spreader 1. Therefore, a wide radiation area can be secured, which is advantageous for improvement of the heat dissipation characteristic of the semiconductor device.

In addition, for example, in mounting radiation fins (not shown) on the heat spreader 1 of the semiconductor device, a wide bonding area can be secured between the radiation fins and the heat spreader 1, which is advantageous for improvement of the radiation characteristic as well as increases the adhesion between the radiation fins and the heat spreader 1.

As described above, according to this embodiment, in the semiconductor device in which the semiconductor chip is mounted on the planar substrate approximately at the center and the hollow portion for housing the semiconductor chip is formed by laminating the annular ring member and adhesive tapes and the planar heat spreader plate on the combination of the substrate and the semiconductor chip, the slit is formed in the adhesive tape(s) to provide an air vent.

As described above, according to this embodiment, the air enclosed in the semiconductor device communicates with the external air via the air vent. Therefore, even when the temperature is increased in a manufacturing process of the semiconductor device, there does not occur an event when the thermally expanded internal air deforms or peels off the heat spreader. Therefore, the semiconductor device can be prevented from being deteriorated in characteristics.

Second Embodiment

Figure 4:
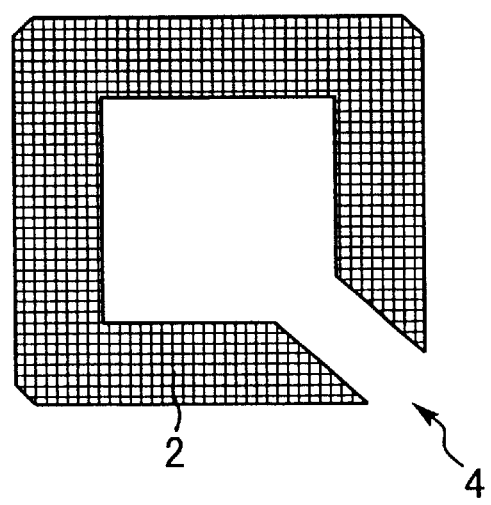
FIG. 4 illustrates a plan view showing another shape of the ring used in a semiconductor device according to a second embodiment of the present invention.

FIG. 4 illustrates a semiconductor device according to a second embodiment of the present invention, and is a plan view showing another shape of the ring 2.

In this embodiment, a slit 4 is formed in the ring 2 unlike the case of the first embodiment in which the slit 4 is formed in the adhesive tape(s). As shown in FIG. 4, as for the position and the shape of the slit 4 of the ring 2, it may be formed at a corner of the ring 2 or may be formed by removing part of a side of the ring 2 so that the ring 2 assumes a C-shape. The slit 4 serves as an air vent portion after manufacture of the semiconductor device.

Two or more slits 4 may be formed in the ring 2.

The other part of the configuration of the semiconductor device is the same as described in the first embodiment and hence redundant descriptions are omitted.

As described above, according to this embodiment, in the semiconductor device in which the semiconductor chip is mounted on the planar substrate approximately at the center and the hollow portion for housing the semiconductor chip is formed by laminating the annular ring member and adhesive tapes and the planar heat spreader plate on the combination of the substrate and the semiconductor chip, the slit is formed in the ring member to provide an air vent.

This embodiment provides the same advantages as the first embodiment.

Third Embodiment

FIGS. 5A and 5B illustrate a semiconductor device according to a third embodiment of the present invention. FIG. 5A is a perspective view in which a semiconductor device is cut at a central position. FIG. 5B is a sectional view of a semiconductor device as another example that is cut at a central position.

In this embodiment, as shown in FIG. 5A, in a semiconductor device in which a hollow cavity is formed by a two-layer structure including the heat spreader 1 and the ring 2, a through-hole 9 (opening) whose area is relatively large but smaller than the area of the semiconductor chip 5 is formed in the heat spreader 1 at the position where the heat spreader 1 is bonded to the semiconductor chip 5. The heat-dissipating resin 6 covering the semiconductor chip 5 is exposed through the through-hole 9.

In the example of FIG. 5B, in a semiconductor device in which a hollow cavity is formed by a two-layer structure including the heat spreader 1 and the ring 2, a plurality of relatively small through-holes 9 (openings) are formed in the heat spreader 1 at the position where the heat spreader 1 is bonded to the semiconductor chip 5. The heat-dissipating resin 6 covering the semiconductor chip 5 is exposed through the through-holes 9.

With the above structures, in a case where radiation fins (not shown) are mounted on the heat spreader 1, heat conduction from the semiconductor chip 5 to the radiation fins can be accelerated. Even after the hole(s) of the heat spreader 1 is closed by mounting of the radiation fins, the slit 4 of the adhesive tape(s) 3 serves as an air vent.

As described above, according to this embodiment, in the semiconductor device, the semiconductor chip is mounted on the planar substrate approximately at the center, and the hollow cavity for housing the semiconductor chip is formed by laminating the annular ring member and adhesive tapes and the planar heat spreader plate on the planar substrate. Further, a slit is formed in the adhesive tape(s) to provide an air vent.

Further, the through-hole(s) is formed in the heat spreader approximately at the center, whereby the heat-dissipating resin that fills in the space between the semiconductor chip and the heat spreader is exposed.

As a result, the heat resistance characteristic as well as the heat dissipation characteristic of the semiconductor device can be improved.

Fourth Embodiment

Figure 6B:
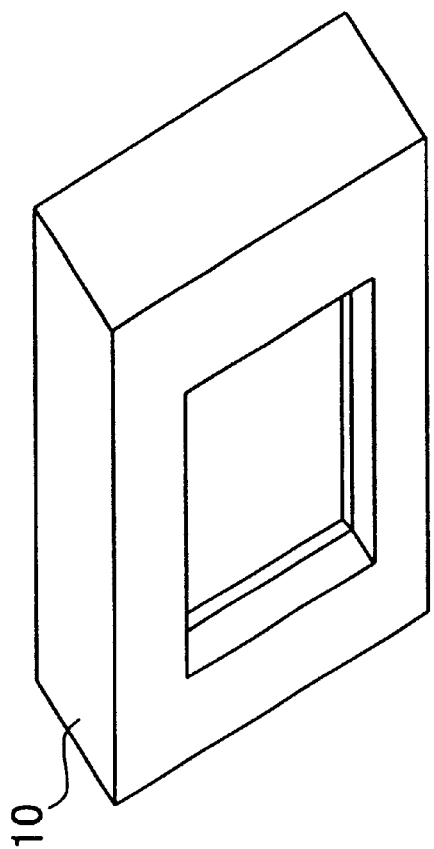
FIGS. 6A and 6B illustrate a semiconductor device manufacturing method according to a fourth embodiment of the present invention.
Figure 6A:
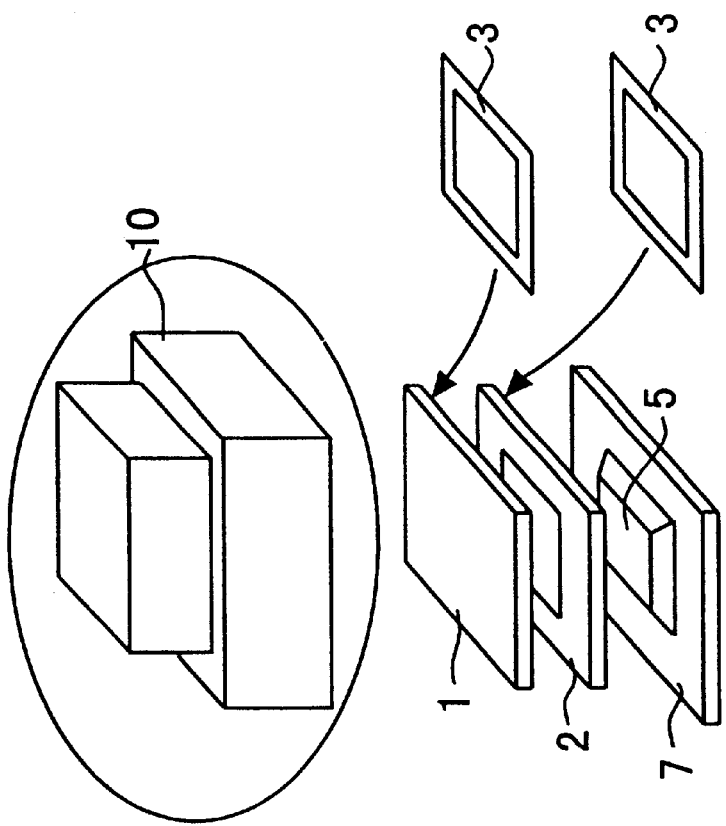
Figure 8:
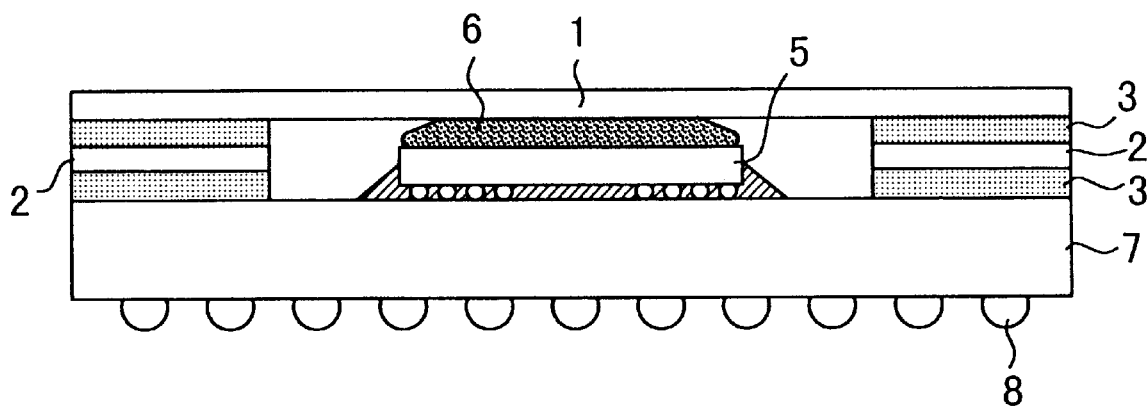
FIG. 8 shows an example of a conventional semiconductor device in a package form.

FIGS. 6A and 6B illustrate a semiconductor device manufacturing method according to a fourth embodiment of the present invention.

As shown in FIG. 6A, according to this semiconductor device manufacturing method, a semiconductor chip 5 is mounted on a planar substrate 7 approximately at the center, and an annular ring 2, annular adhesive tapes 3, and a planar heat spreader 1 are laminated and bonded to the combination of the substrate 7 and the semiconductor chip 5.

In this step, pressure is applied to only the annular adhesive tape 3 portion outside the semiconductor chip 5 by means of a pressurizing head 10 that has an annular protrusion as shown in FIG. 6B.

As described above, this embodiment is characterized in that the surface of the pressurizing head 10 that is used for thermal pressure bonding of the heat spreader 1 and the ring 2 in manufacture of a semiconductor device is given a ring shape.

This makes it possible to prevent the semiconductor chip 5 from being damaged by pressure application, which prevents instantaneous setting of a heat-dissipating resin 6, which in turn prevents voids from being produced in the heat-dissipating resin 6.

Fifth Embodiment

FIGS. 7A–7C illustrate a semiconductor device manufacturing method according to a fifth embodiment of the present invention.

In general, such members as the heat spreader 1 and the ring 2 are protected before their use by means of cover films bonded to their surfaces. In a semiconductor device manufacturing process, those cover films need to be peeled off.

In this embodiment, this is done in the following manner. First, after a peeling tape 12 is mounted on a peeling stage 13 as shown in FIG. 7A, a heat spreader 1 having a cover film 11 is pressed against the peeling tape 12 from above as shown in FIG. 7B. Then, the peeling tape 12 is slid and the heat spreader 1 is removed by using an absorbing tool, for example. Since the cover film 11 is strongly bonded to the peeling tape 12, the cover film 11 can be peeled off the heat spreader 1.

As described above, according to this embodiment, in the step in which the semiconductor chip 5 is mounted on the planar substrate 7 approximately at the center and the annular ring 2 and adhesive tapes 3 and the planar heat spreader 1 are laminated and bonded to the combination of the substrate 7 and the semiconductor chip 5, the heat spreader 1 and the ring 2 each having the cover film 11 are bonded to the peeling tape 12. Then, the heat spreader 1 and the ring 2 are removed from the respective cover films 11 that are bonded to the peeling film 12 by utilizing a feed of the peeling tape 12 and lifting force of an absorbing tool or the like that is attached to the heat spreader 1 or the ring 2.

That is, this embodiment is characterized in that the cover film 11 that adheres to the adhesive-tape-bonded surface of the cap such as the heat spreader 1 or the ring 2 is peeled off on the peeling stage 13 by means of the peeling tape 12 by utilizing a difference in adhesion.

As described above, according to this embodiment, in the step in which the semiconductor chip is mounted on the planar substrate approximately at the center and the annular ring member and adhesive tapes and the planar heat spreader plate are laminated and bonded to the combination of the substrate and the semiconductor chip, the heat spreader plate and the ring member each having the cover film are bonded to the peeling tape. Then, the heat spreader plate and the ring member are removed from the respective cover films that are bonded to the peeling film.

This makes it possible to easily peel off the cover films.

Having the features described above, the invention makes it possible to prevent damaging of the semiconductor chip of the semiconductor device as well as deterioration in the heat dissipation characteristic of the semiconductor device. Further, the invention facilitates peeling of the cover films.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-161657, filed on Jun. 8, 1999 including specification, claims, drawings and summary, on which the Convention priority of the present application is based, are incorporated herein by reference in its entirety.

What is claimed is:

1. A semiconductor device comprising:

a planar substrate;

a semiconductor chip mounted on said planar substrate approximately at the center thereof; and an annular ring member, annular adhesive tapes, and a heat spreader plate that are laminated on the substrate so as to form a hollow cavity that houses said semiconductor chip, at least one of said adhesive tapes having a slit to serve as an air vent.

2. The semiconductor device according to claim 1, further comprising a heat-dissipating resin that fills in a space between said semiconductor chip and said heat spreader plate, said heat spreader plate having at least an opening that exposes said heat-dissipating resin.

3. A semiconductor device comprising:

a planar substrate;

a semiconductor chip mounted on said planar substrate approximately at the center thereof; and an annular ring member, annular adhesive tapes, and a heat spreader plate that are laminated on said substrate so as to form a hollow cavity that houses said semiconductor chip, said annular ring member having a slit to serve as an air vent.

4. The semiconductor device according to claim 3, further comprising a heat-dissipating resin that fills in a space between said semiconductor chip and said heat spreader plate, said heat spreader plate having at least an opening that exposes said heat-dissipating resin.

* * * * *